United States Patent [19]
Pasch et al.

[11] Patent Number: 5,682,323
[45] Date of Patent: Oct. 28, 1997

[54] SYSTEM AND METHOD FOR PERFORMING OPTICAL PROXIMITY CORRECTION ON MACROCELL LIBRARIES

[75] Inventors: Nicholas Pasch, Pacifica; Nicholas Eib, San Jose; Jeffrey Dong, Milpitas, all of Calif.

[73] Assignee: LSI Logic Corporation, Santa Clara, Calif.

[21] Appl. No.: 401,099

[22] Filed: Mar. 6, 1995

[51] Int. Cl.$^6$ .................. G06F 15/00; H01L 29/76
[52] U.S. Cl. ............. 364/491; 364/488; 364/489; 364/490; 364/474.28; 257/386; 257/390; 257/503
[58] Field of Search ................ 364/488, 489, 364/490, 491, 578, 474.28, 474.2; 250/492.3, 492.1, 492.2, 492.22, 398; 257/207, 208, 211, 370, 205, 206, 204, 386, 390, 503, 508, 629, 659, 202; 371/22.3, 22.4, 25.1; 395/13

[56] References Cited

U.S. PATENT DOCUMENTS

| | | | |
|---|---|---|---|
| 4,580,228 | 4/1986 | Noto | 364/491 |
| 4,584,653 | 4/1986 | Chih et al. | 364/491 |
| 4,613,940 | 9/1986 | Shenton et al. | 364/490 |
| 4,701,778 | 10/1987 | Aneha et al. | 257/208 |
| 4,949,275 | 8/1990 | Nonaka | 364/490 |
| 5,173,864 | 12/1992 | Watanabe et al. | 364/491 |
| 5,182,718 | 1/1993 | Harafuji et al. | 364/490 |
| 5,223,733 | 6/1993 | Doi et al. | 257/386 |
| 5,251,140 | 10/1993 | Chung et al. | 364/474.02 |
| 5,253,182 | 10/1993 | Suzuki | 364/489 |
| 5,294,800 | 3/1994 | Chung et al. | 250/492.22 |
| 5,379,233 | 1/1995 | Tripathi et al. | 364/491 |
| 5,387,810 | 2/1995 | Seta et al. | 257/370 |
| 5,388,054 | 2/1995 | Tokumaru | 364/489 |

OTHER PUBLICATIONS

Otto et al "Automated Optical Proximity Correction—a Rules–Based Approach" Mar. 1994 pp. 278–284.

*Primary Examiner*—Jacques Louis-Jacques
*Attorney, Agent, or Firm*—Fenwick & West LLP

[57] ABSTRACT

The system and method performs optical proximity correction on an integrated circuit (IC) mask design by initially performing optical proximity correction on a library of cells that are used to create the IC. The pre-tested cells are imported onto a mask design. All cells are placed a minimum distance apart to ensure that no proximity effects will occur between elements fully integrated in different cells. An optical proximity correction technique is performed on the mask design by performing proximity correction only on those components, e.g., lines, that are not fully integrated within one cell.

9 Claims, 4 Drawing Sheets

SYSTEM AND METHOD FOR PERFORMING OPTICAL PROXIMITY CORRECTION ON MACROCELL LIBRARIES

BACKGROUND OF THE INVENTION

1. Field of the Invention

The invention relates to the area of electronic design automation (EDA), more particularly to optical proximity correction of sub-micron mask designs.

2. Description of Background Art

A fabrication mask or reticle is used when fabricating a semiconductor device. Such a mask has a light-transparent portion and a light-shielding portion that constitute a circuit pattern to be exposed on a wafer. The mask and reticle must have a precisely defined circuit pattern. Photolithography is a process used for patterning semiconductor wafers during the manufacture of integrated circuits, e.g., an application specific integrated circuit (ASIC).

Photolithographic performance is determined by measuring and controlling two parameters: (1) the critical dimension (CD) of the pattern on the mask, i.e., the size of critical features on the pattern, e.g., line width; and (2) pattern registration (PR), i.e., the relative placement of pattern features with respect to one another on the mask.

Modern fabrication techniques have masks whose critical dimension is less than 0.5 micrometers (μm or microns). Circuit fabrication techniques using masks having such a small critical dimension causes resolution problems when exposed to light because of errors introduced by first order diffraction and second order diffraction of the light when passing near design elements whose width is close to the critical dimension. These diffraction errors can be compensated for by increasing the thickness of various critical features on the pattern. For example, increasing the width of a line on the pattern will reduce the diffraction effects. One problem with this solution is that when multiple patterns are placed in close proximity to each other the diffraction effects may cause two or more lines to intersect on the wafer. Such an intersection can render the wafer useless by altering the response characteristics of the wafer.

A wafer can be comprised of thousands of cells where each cell comprises many lines whose diffraction effects must be accounted for. One current solution is to correct a collection of lines on a wafer simultaneously. This process is repeated until the entire mask design is corrected (full mask correction). This technique is called optical proximity correction (OPC).

A problem with using OPC when performing a full mask design correction is that a substantial commitment must be made in terms of time and computing power in order to optically correct the integrated circuit design, e.g., an ASIC design.

What is needed is a system and method for efficiently and accurately correcting sub-micron integrated circuit designs.

SUMMARY OF THE INVENTION

The invention is a system and method for performing optical proximity correction on an integrated circuit (IC) mask design by initially performing optical proximity correction on a library of cells that are used to create the IC. The pre-tested cells are imported onto a mask design. All cells are placed a minimum distance apart to ensure that no proximity effects will occur between elements fully integrated in different cells. An optical proximity correction technique is performed on the mask design by performing proximity correction only on those components, e.g., lines, that are not fully integrated within a cell.

DETAILED DESCRIPTION OF THE PREFERRED EMBODIMENTS

A preferred embodiment of the present invention is now described with reference to the figures where like reference numbers indicate identical or functionally similar elements. Also in the figures, the left most digit of each reference number corresponds to the figure in which the reference number is first used.

The invention is directed to system and method for performing optical proximity correction (OPC) on an integrated circuit (IC) mask design by initially performing optical proximity correction on a library of cells that are used to create the IC. The pre-tested cells are placed on a mask design. All cells are placed a minimum distance apart to ensure that no proximity effects will occur between components fully integrated in different cells. OPC is a technique for correcting line width variations. The line width variations are due to diffraction effects, as described above.

Figure 1:
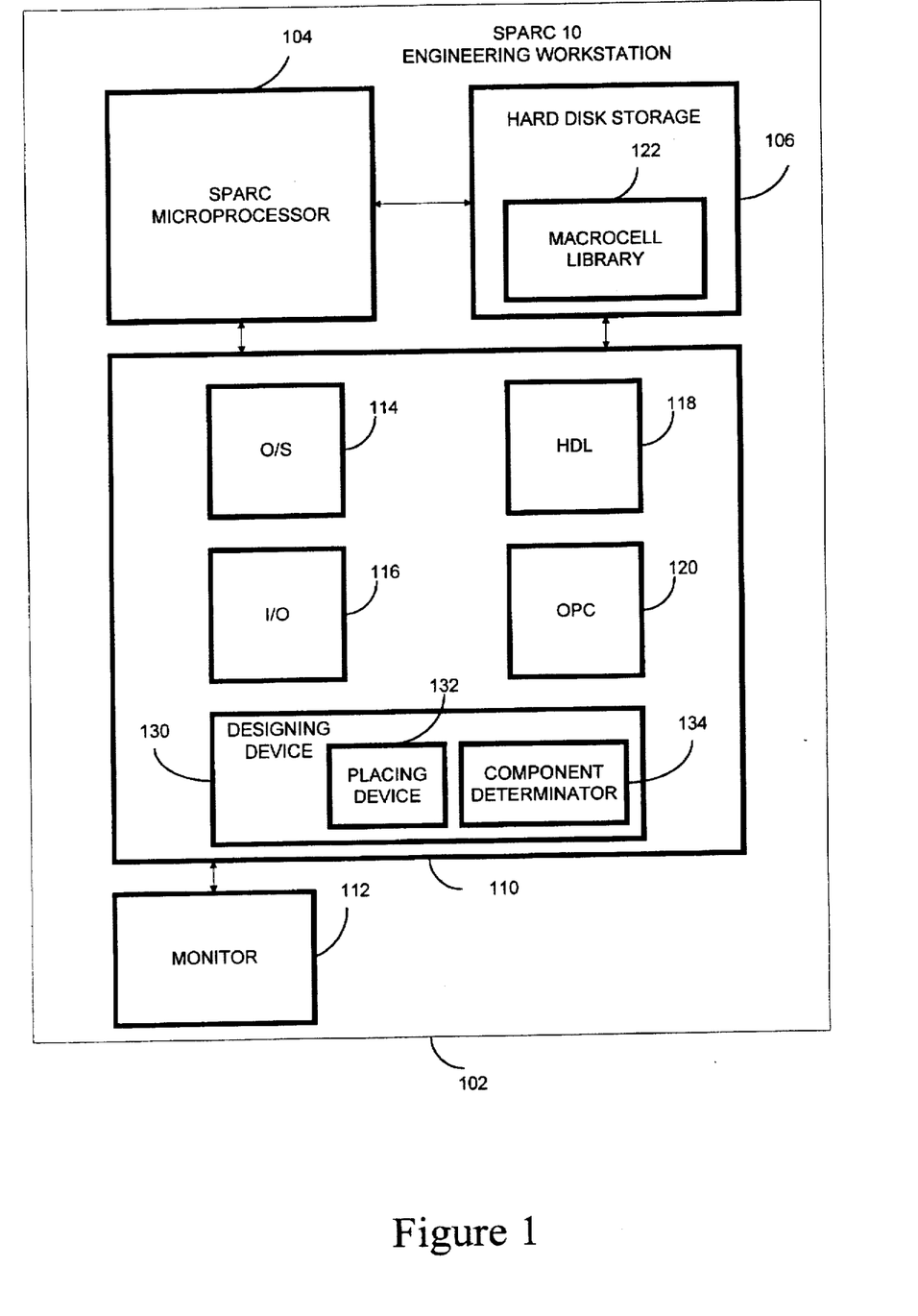
FIG. 1 is an illustration of an environment in which the present invention operates.

FIG. 1 illustrates an environment in which the present invention operates. The preferred embodiment operates on an engineering workstation 102, e.g., a SPARC Station 10 that is commercially available from Sun Microsystems, Inc., Mountain View, Calif. A SPARC Station 10 includes a SPARC microprocessor 104 that is coupled to a non-volatile storage device, e.g. a conventional hard disk storage device 106. The SPARC microprocessor 104 and the hard disk storage device 106 are coupled to a volatile storage device, e.g. a random access memory (RAM) 110. A user interface, e.g., a monitor 112, is coupled to the workstation 102. The RAM 110 includes an operating system (O/S) 114, e.g., UNIX, a conventional input/output (I/O) module 116, a hardware description language (HDL) module 118, and an optical proximity correction (OPC) module 120. In addition, the RAM 110 includes a designing device 130 that includes a placing device 132 and a component determinator 134. The functions performed by the designing device 130, the placing device 132, and the component determinator 134 are described in greater detail below with respect to FIG. 3.

A HDL located within HDL module 118 can be, for example, Verilog, commercially available from Cadence Design Systems Inc., San Jose, Calif., or very high speed integrated circuit hardware description language (VHDL). The OPC module 120 includes physical data instructions, that when implemented by the SPARC microprocessor 104 causes the SPARC microprocessor to perform an OPC on one or more target cells, described below.

The hard disk storage 106 includes a macro cell library 122. The macro cell library is a physical database representing a collection of macro cells. In alternative embodiments the physical database can represent any combination of design elements, e.g., a standard cell. When designing an IC, a designer can create a mask design by directly designing all of the logic that is necessary for a particular IC. However, this is an inefficient method of circuit design. A more efficient technique involves designing a group of logic "building blocks", i.e., cells, and storing these cells in a cell library. A designer may frequently use a particular combination of the cells, e.g., if they perform a particular function. A macrocell is a combination of cells. A collection of macrocells can be created and stored in a macrocell library.

As discussed above, OPC is a technique that corrects a mask design against potential light diffraction effects. In conventional systems a mask design is fully created and is then corrected using an OPC technique. Some examples of OPC techniques are described in Otto, et al., *Automated Optical Proximity Correction—A Rules-based Approach*, SPIE Optical/Laser Microlithography VII, March 1994, and Helmsen et al. *3D Lithography Cases for Exploring Technology Solutions and Benchmarking Simulators*, SPIE: Optical/Laser Microlithography VI, pp. 382–294, March 1994, that are incorporated herein in their entirety. A medium sized ASIC design, i.e., an ASIC design contained within a mask of having a size of approximately 8 mm$^2$, currently requires approximately twelve hours to be fully corrected using a tradition OPC technique. An ASIC designer may need to perform a full-mask design OPC on tens of thousands of ASIC designs annually. Accordingly, a significant time and computing commitment must be invested in order to perform OPC on all of a designer's ASIC designs.

A description of a general technique for performing optical proximity correction is described in the Otto et al. reference that was incorporated by reference above and whose text is reproduced, in part, below. Recent advances in lithography resolution enhancement techniques such as phase shifting masks and off-axis illumination have raised the possibility of applying I-line photolithography to 0.35 µm generation IC's. To achieve the necessary dimensional control with these techniques, proximity effects—especially the optical proximity effect—must be compensated. In this paper, we present an automated approach to optical proximity correction (OPC) that is both effective and fast. This work is a joint effort between AT&T, SEMATECH and Trans Vector Technologies.

Proximity effects cause printed line edge positions to vary depending on the density, sizes and locations of nearby features. The goal of OPC is to judiciously modify the mask layout so the original design geometries are reproduced on the wafer for a given stepper system. The correction scheme must work for arbitrary two-dimensional patterns that are found in both random logic and memory circuits, not just one-dimensional line/space gratings. A viable correction scheme must be implemented in a software tool capable of managing large, high-density layouts and which can complete the computation in a reasonable amount of time. In this work, we demonstrate the power and effectiveness of a rules-based OPC approach. The rules consist of edge rules and corner rules for biasing feature edges and for adding sub-resolution assist features.

Rules parameter generation for conventional masks, phase shifting masks and assist feature masks for on- and off-axis illumination conditions have been performed using software developed for SEMATECH by AT&T. The rules parameter generation software uses an aerial image simulator based on SPLAT from U.C. Berkeley. Layout compensation was achieved by applying the rules with layout correction software, OPRX™, developed by Trans Vector Technologies. The layout compensation software manages the design hierarchy to minimize "flattening" of the layout data, so that computational time and data volume are reduced. Finally, we printed 0.35 µm CD proximity-corrected random logic designs using an I-line stepper.

A proximity correction tool can be based on one or a combination of two paradigms: rules-based or model-based. A rules-based approach consists of applying a predetermined correction which applies to the local layout geometry. A model-based approach consists of computing the required corrections for the local layout from models for the imaging system and the development and etching processes. A model-based approach is effective only if the models accurately represent the imaging and pattern transfer processes. If the models are good, there is still the fundamental problem that model-based correction is extremely computation intensive and iteration may be required for the corrections to converge.

In principle, a rules-based approach is a fast, powerful paradigm. Complex imaging, substrate and process phenomena can be folded into comparatively few parameters. These parameters define how to pre-compensate the layout for the combined effects of those phenomena using table lookups and simple arithmetic. The application of such rules to modify a layout is much faster than direct modeling. The rules parameters can be derived from models, from empirical results or from a combination of both. Once the rules parameters have been derived for a given process, they apply for all features on all masks.

The ideal mathematical objective of a proximity correction scheme is to compensate for the effect of neighboring features on edge placements so that the final on-wafer pattern is the same as the original layout specification. Corner rounding will occur and is acceptable to some degree depending on the application. The minimum corner radius is governed by the mask making tool, the optical stepper and the fabrication process. For any edge in the layout, the edge placement correction can be expressed as $$\delta_i = \delta(E, F, G_i), \quad (1)$$

where

E is the value for exposure,

F is the value for focus, $G_i$ is the final on-wafer geometry in the area around edge i.

By selecting an operating point for exposure, $E_0$, and defocus, $F_0$, Equation 1 becomes $$\delta_i = \delta(G_i), \quad (2)$$

where $\delta_i = \delta(E_0, F_0, G_i)$.

Equation 2 is the "rule" for correcting the placement of edge i. The challenge in a rules-based approach is to parameterize $G_i$ so that the parameterization covers a large number of geometric situations. Suppose the symbol I represents a category of geometric situations which applies to a significant subset of all possible edge environments. The objective is to find a geometric parameterization $$G_i = G_I(p_1, p_2, \ldots, p_n), \quad (3)$$

where $G_i$ is a parameterization which applies to any edge falling in category I, $p_j$ is the jth parameter describing the geometric situation, n is the number of parameters.

Thus for any edge falling in category I, the edge placement correction rule is:

$$\delta_i = \delta_i(p_{1i}, p_{2i}, \ldots, p_{ni}), \quad (4)$$

where $\delta_i$ is a rule which applies to any edge falling in category I, $p_{ji}$ is the value of the jth parameter for edge i.

$$\delta_{equal\ line/gap}(w), \text{ where } w \text{ is line width} \quad (5)$$

$$\delta_{isolated\ line}(w), \text{ where } w \text{ is line width} \quad (6)$$

Each of these rules represent a large number of geometric situations and can be expressed with a single parameter. The rules may be represented as tables with $\delta$ values defined for specific values of $w$ which are parameter grid points. Values of $\delta$ for $w$ parameter values which are not on the grid points are determined by interpolation between the Grid points. A generalization which combines of Equations 5 and 6 is $$\delta_{periodic\ line/gap}(w,g), \text{ where } w \text{ is line width, } g \text{ is gap width} \quad (7)$$

In addition to incorporating the two pervious rules, this rule covers a broader class of geometric situations. Again, the rule may be represented as a table with $\delta$ values defined on two-dimensional (w,g) grid points. Values of $\delta$ for (w,g) parameter values which are not on grid points are determined by two-dimensional interpolation between grid points. Similarly for more than two parameters, non-grid-point parameters require multi-dimensional interpolation.

Aerial image simulations with high NA, I-line lithography with 0.35 µm CDs, show that even the rule in Equation 7 is inadequate for correcting many 1-dimensional situations. Our investigations, however, indicate that a 5-parameter rule works quite satisfactorily:

$$\delta_{1D}(L_0, G_0, L_1, G_1, L_2) \quad (8)$$

where $L_0$ is the width of the line for which this is the edge $G_0$ is the width of the gap for which this is the edge $L_1$ is the width of the line across the gap $G_0$ $G_1$ is the width of the gap on the other side of $L_0$ $L_2$ is the width of the line across the gap $G_1$ We have found that an important class of 2-dimensional effects are satisfactorily handled with the addition of two more parameters to the 1D rule: the length of the edge in question and the length of the edge across the gap. We refer to this as a 1.5D rule since it is not really a general 2-dimensional rule and does not apply to corners in particular. It does however satisfactorily handle line-end shortening effects. The 1.5D rule is expressed as:

$$\delta_{1.5D}(L_0, G_0, L_1, G_1, L_2, W_0, W_1) \quad (9)$$

where $W_0$ is the length of this edge $W_1$ is the length of the edge across the gap $G_0$ We have had success in improving corner radii for 90° (inside) and 270° (outside) corners by constructing corner insets and serifs, respectively, with 2D corner rules of the type:

$$\delta_{2D\ corner}(L_{x0}, L_{y0}, G_{x0}, G_{y0}, L_{x1}, L_{y1}) \quad (10)$$

where $L_{x0}$ is the width of the corner figure perpendicular to this edge of the corner $L_{y0}$ is the width of the corner figure perpendicular to the other edge of the corner $G_{x0}$ is the width of the gap adjacent to this edge $G_{y0}$ is the width of the gap adjacent to the other edge $L_{x1}$ is the width of the line across the gap $G_{x0}$ $L_{y1}$ is the width of the line across the gap $G_y$.

Common non-orthogonal angled corners such as 135° (obtuse inside) and 225° (obtuse outside) do not yet have explicit rules generation support, however, preliminary simulations indicated that scaled versions (so as to reduce the serif size) of the right angle cases work fairly well. Intermediate angles (e.g. between 90° and 135°) can be handled by interpolation. This can be managed conveniently by merging the two tables (e.g. for 90° and 135°) and adding an angular range parameter $0° < \alpha_{inside} < 180°$, $180° < \alpha_{outside} < 360°$:

$$\delta_{2D\ inside\ corner}(\alpha_{inside}, L_{x0}, L_{y0}, G_{x0}, G_{y0}, L_{x1}, L_{y1})$$

$$\delta_{2D\ outside\ corner}(\alpha_{outside}, L_{x0}, L_{y0}, G_{x0}, G_{y0}, L_{x1}, L_{y1})$$

Corners can appear in a variety of geometric situations, not all of which are well represented by the parameterizations in Equations 11 and 12. Investigations are in progress into a robust collection of corner classifications and rule parameterizations.

Garofolo et al. have shown that sub-resolution assist features (extra, or outrigger features) and/or sub-resolution assist slots (voids within a pre-existing feature) can extend the applicability of off axis illumination, mitigate sidelobe problems in attenuating or rim phase-shift masks, and may be utilized to reduce proximity effects. The parameterizations remains unchanged, but each table entry rather than being a single value representing the shift of the edge in question, is five values: the edge shift, the offset to the assist feature, the width of the assist feature., the offset to the assist slot, and the width of the assist slot.

For a process engineer the objective of proximity correction is for all edge placements on the layout be within +10%(CD/2) of the layout specification over a common process (exposure/focus) window within which the processing facility can operate reliably. In writing Equation 2, a specific operating point was chosen for exposure and focus. But the process engineer requires a finite window of exposure and focus.

If the operating point for a given rules table entry were allowed to range over a finite exposure/focus window centered on the preferred operating point, a 2-dimensional map of correction values for a specific situation would be generated. That map would have a maximum and minimum value. Let us define the "median" correction value as the average of the maximum and the minimum correction values. Since, in general, the dependence of the correction value on exposure and focus is not linear, the median correction value is not the same as the value at the center of the exposure/focus window.

Instead of containing correction values based on the preferred exposure and focus values, the table could contain the median of values over the exposure/focus window, then the rules would not be optimum for any single exposure/focus combination, but would be optimized for maximum exposure/focus tolerance. One might choose the mean value instead of the median value if a better correction than provided by the median is desired over most of the focus range. A mean weighted by the probability of focus value could be used if the probability distribution of focus is known not to be uniform.

A table with seven parameters has a minimum of $2^7=128$ grid points, since each parameter must have at least two grid values for the table to show a dependence upon that parameter. If each parameter had 3 grid values, the table would have $3^7=2187$ entries. To obtain good correction it is more likely that L0, G0 and L1 might require 10, 10 and 5 grid points so that a table might have $10\times10\times5\times3\times3\times3\times3=40,500$ entries. For a computer program, this is not an excessive amount of information. To generate that number of table entries with a tool based on an optical aerial image simulator is an intensive but not excessive activity, and once performed is applicable to any layout. To generate 40,500 table entries by physical measurement would require very high speed data acquisition-faster than 1 measurement per second, which does not appear feasible with today's measurement techniques. However, measurement of 128 points is quite feasible.

Simulation can be good at displaying trends and fine-grained behavior. If one accepts simulated results as representative of fine-grained behavior, then measured results on a much coarser grid could be used to "anchor" the rules tables generated by simulation. Anchoring requires at least two measured points to be specified. The simulated data is reshaped to match the measured data points so that extracting a measured value for a measured data point is guaranteed. An analogous technique applies for multiple parameters. The more measured points there are, the better the anchoring, but anchoring to even as few as two measured points is better than no anchoring at all. This form of anchoring for multi-dimensional tables is available in our rules application tool, OPRX.

In this section we will describe the rule format evolution from 1D patterns through formats that may be viably applied to generic 2D geometric configurations. Once these formats were derived, an aerial-image based optimization system was applied to synthesize the OPC correction directives. While there appears good agreement between aerial-image predicted and resist measured behavior for most advanced resist systems, some resists deviate from that directed by the latent image. For such cases, we are developing first order models that will be incorporated into the rule generation process. Also, as is discussed elsewhere in the paper, empirical measurements may also be used to fortify simulation based rules. In any event, an appropriate rule format and associated optimization or measurement pattern "templates" are necessary. The evolution of such templates will not be described.

Partially coherent optical imaging is an inherently nonlinear process. As such, many powerful linear signal processing approaches are rendered ineffective. For instance, the influence of one mask aperture on another may not be simply superposed. Rather, interacting apertures are related by the mutual coherence function.

$$\mu(\chi)=2J_1(\chi\sigma NA/\lambda)/(\chi\sigma NA/\lambda),$$

where $\chi$ is the aperture separation, $\sigma$ is the partial coherence of the stepper, $\lambda$ is the radiation wavelength and NA is the system numerical aperture.

The inter-feature proximity effects increase with light coherence and decrease as the wavelength is reduced. As optical lithography moves toward imaging features with critical dimensions (CD) in the $k_1=0.5$ regime (CD=$k_1\lambda$/NA), optical proximity effects become significant. For this case, the edge deviation results (from both edges) in a proximity induced CD change of 20%. Current process requirements demand a total CD variation of +10%. The optical proximity factor devours the entire lithography and etch process budget.

A rule format for the 1D case is rather straightforward. The edge correction should be a function of L0, G0 and, depending on $\sigma$ and the $k_1$ factor, G1, L1 and L2 may also need inclusion. As described previously, our 1D format is flexible in that one may include the influence of as many edges as desired.

The rule synthesis methodology we employ involves the optimization of pattern templates. While the details of this process will be further described when we address more advanced formats, in this 1D case, the template is optimized by adjusting the mask feature so that the ensuing printed image will more closely match the design. Correction rules are then based upon the particular predistortions derived by the template optimization process. A complete rule set results from a series of these optimizations that sufficiently samples the parameter space (L0,G0, ...)

When considering optical effects, the selection of the sample parameter "grid" (the number of placements and placement values for each parameter) may be Guided from some fundamental principles. Light diffracted through an aperture results in spill-over that exhibits the classic Bessel function behavior. The first minimum occurs near 0.6 $\lambda$/NA. The first "side-lobe" is approximately 0.5 $\lambda$/NA wide and the associated electric field is 180 degrees out of phase with the central light, a phenomenon exploited by some phase-shifting mask techniques. The first, and to some extent, the second side-lobe interact with neighboring features as determined by the mutual coherence function $\mu(\chi)$. In terms of estimating proximity effect ranges, the mutual coherence for $\sigma=0.5$ drops below 50% as the inter feature separation grows beyond 0.75 $\lambda$/NA. For our earlier example, this correspond to 1.1 µm. Note that the proximity effect diminishes to negligible levels for G0s beyond this value.

While the above considerations provide an indication of the range, we must also address the density of sample points within this range. Assuming the pattern conversion process linearly interpolates between "ruled" parameter states, we should attempt to provide explicit rules at function "inflection" points.

Figure 2:
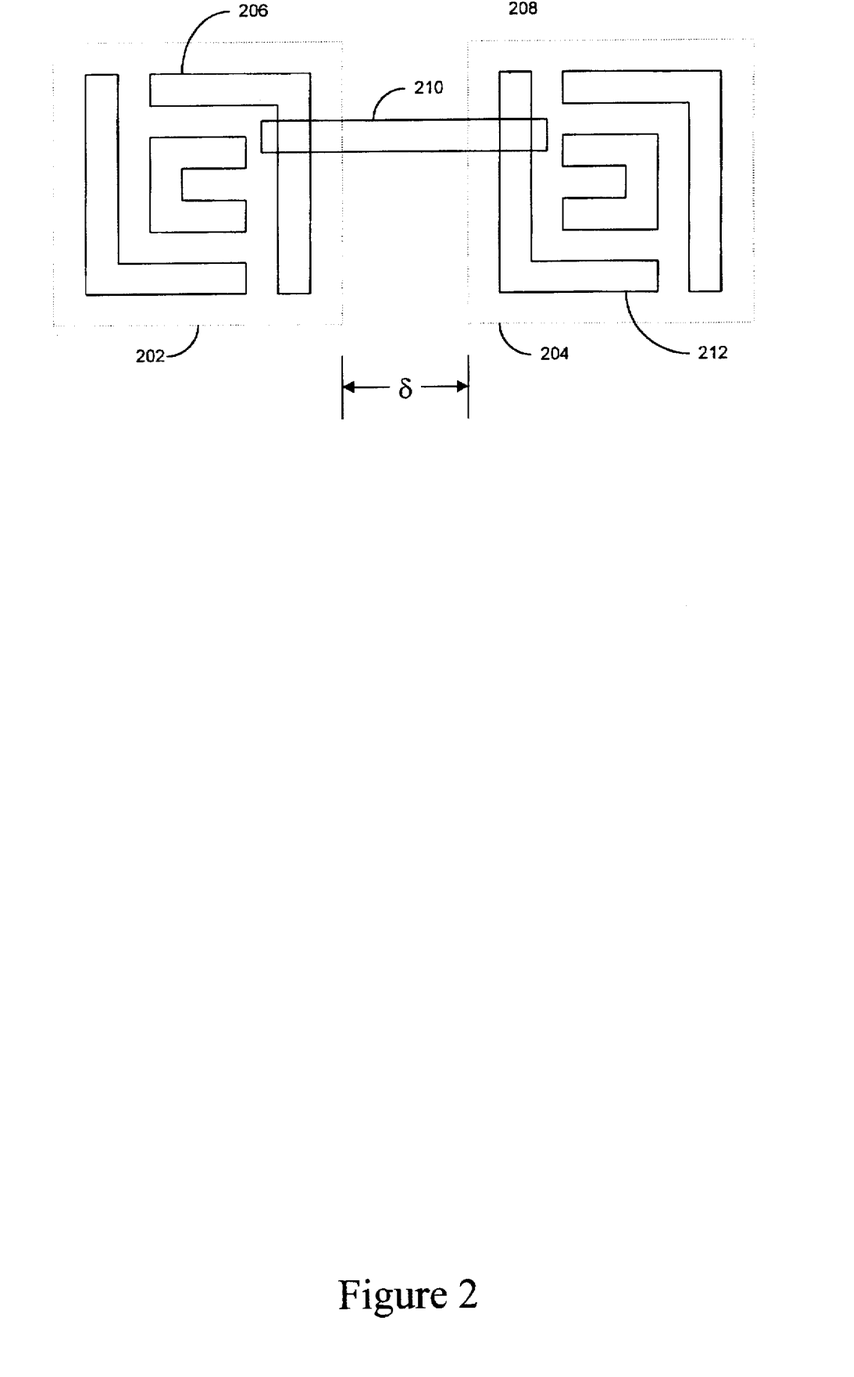
FIG. 2 is an illustration of two cells on a photolithographic mask design.

FIG. 2 is an illustration of two cells 202, 204 located on a mask design 208. Each cell 202, 204 includes a pattern comprised of shapes, e.g., lines 206 and 212.

Figure 3:
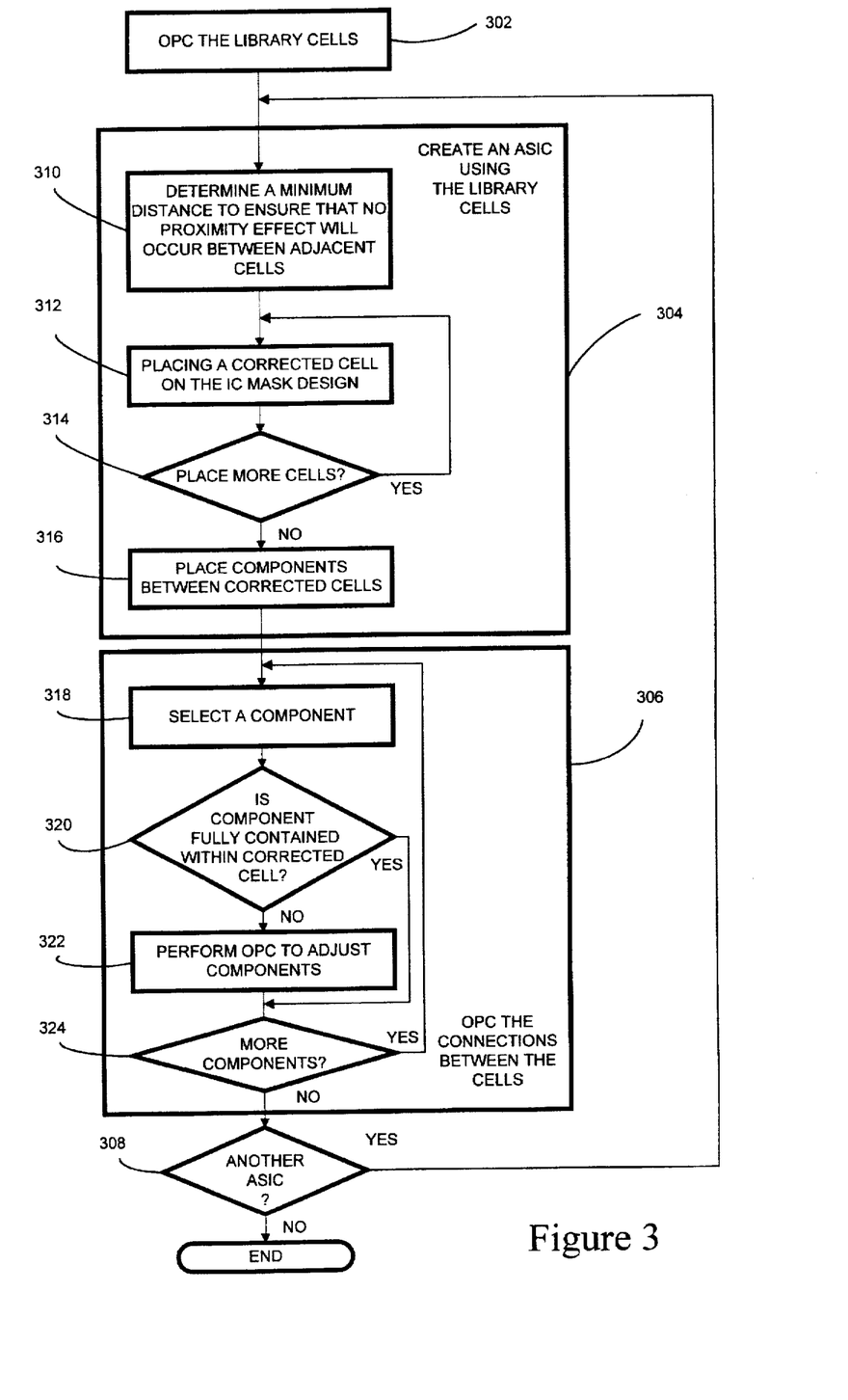
FIG. 3 is a flowchart of the method of the preferred embodiment of the present invention.

FIG. 3 is a flowchart of the method of the preferred embodiment of the present invention. The present invention significantly reduces the time and cost of performing OPC. Instead of performing OPC on a full-mask design, the macrocells (or cells) located in the macrocell library 122 are initially optical proximity corrected 302, i.e., before they are integrated into the ASIC design. All macrocells in a medium sized macrocell library 122 can be optical proximity corrected in approximately twenty hours.

Figure 4:
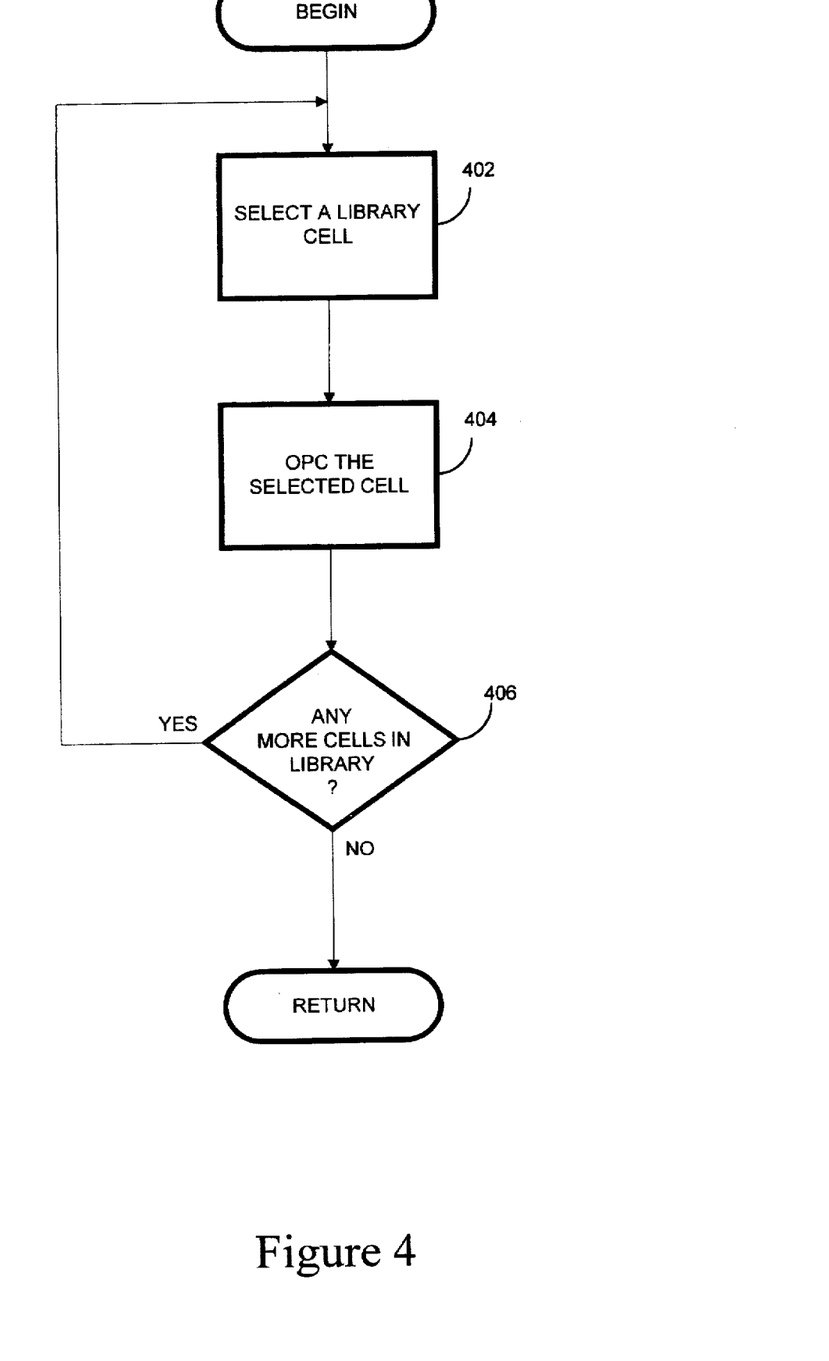
FIG. 4 is a detailed flowchart of the method of performing OPC on the cells of a macrocell library.

FIG. 4 is a flowchart of the method for performing OPC on the library cells 302. The processor 104 selects 402 a macrocell from the macrocell library 122. The processor 104, in response to the commands in the OPC module 120, executes 404 the optical proximity correction on the chosen macrocell using a known OPC technique. The processor 104 repeats steps 402–404 until determining 406 that all cells have been optical proximity corrected.

Once a macrocell is optical proximity corrected 302, it can be used in creating 304 an ASIC design without requiring that significant OPC be performed on the ASIC design. There are at least two areas of the ASIC design that may need to optical proximity corrected. These areas are macrocell interfaces and macrocell boundaries.

The connections or interfaces between the macrocells in the design must be optical proximity corrected. FIG. 2 illustrates an example of an interface 210 between two macrocells 202, 204. Since the interface 210 is not fully integrated within either macrocell 202, or macrocell 204 it cannot be optical proximity corrected when the macrocells in the macrocell library 122 are optical proximity corrected 302. Therefore, the interfaces can only be optical proximity corrected 306 after all macrocells of the ASIC design are placed by the processor 104. The present invention is a variation on conventional ASIC design techniques using OPC. Such general techniques for designing ASICs and performing OPC will be apparent to persons skilled in the art. As described below with reference to FIG. 3, a minimum distance between adjacent cells is determined 310 such that no proximity effect will occur between adjacent cells if this minimum distance separates the adjacent cells. The placing device 132 places 312, 314 corrected cells, from the corrected macrocell library 106 in the IC mask design such that adjacent cells are separated by the minimum distance. After the corrected cells are placed in the IC mask design, connecting components are placed between the corrected cells in order to complete the initial phase of the IC design.

After placing all of the connecting components, OPC is performed 306 on the connections between the cells, e.g., on all components not located completely in a cell and on the affected cells. For each component 318, the component determinator 134 determines 320 is a component is fully contained within a corrected cell. If the component is not located within a corrected cell, the OPC 120 performs 322 OPC and adjusts the component to correct for any optical proximity effects. If there are no more components 324 the process can repeat.

As discussed above, each macrocell in the macrocell library 122 was optical proximity corrected individually. Therefore, when two or more macrocells are placed in close proximity to each other, optical proximity effects may occur at the boundaries of these adjacent macrocells. For example, with reference to FIG. 2, proximity effects may occur between elements 206 of macrocell 202 and element 212 of macrocell 204. As a result, it appears that all macrocell boundaries must be optical proximity corrected. However, the present invention eliminates the requirement of macrocell boundary correction by ensuring that the macrocells 202, 204, are separated by a minimum distance, δ, as shown in FIG. 2. The minimum distance, δ, must be wide enough to ensure that no optical proximity effects will occur. A δ of approximately 0.35 microns will ensure that optical proximity effects will not occur between elements of two adjacent macrocells.

After the processor 104 corrects the ASIC design using OPC 306 another ASIC can be designed 308 by repeating steps 304–306. The new ASCI design can use the previously optical proximity corrected macrocell library 112.

The present invention significantly reduces the time commitment for performing an optical proximity correction on an integrated circuit. The invention initially performs optical proximity correction on a macrocell library. Once corrected, the macrocell library can be re-used without correcting any elements wholly contained within a macrocell.

What is claimed is:

1. A computer implemented method for designing a sub-micron integrated circuit mask design having a plurality of cells from a predefined cell library, comprising the steps of:

selecting a cell representation from the predefined cell library;

adjusting internal elements of said cell representation to correct for proximity effects within said cell representation to create a corrected cell representation;

repeating said selecting step and said adjusting step for each of the cell representations in the predefined cell library to create a plurality of corrected cell representations; and designing the sub-micron integrated circuit mask design after completing said repeating step, including the steps of:

placing one or more of said plurality of corrected cell representations on said integrated circuit mask design such that a minimum distance separates each of said plurality of corrected cell representation to ensure that no proximity effects occur between adjacent corrected cell representations, determining if a first component of said integrated circuit mask design is not fully contained within a first corrected cell representation of said plurality of corrected cell representations, and adjusting said first component and said internal elements of said first corrected cell representation to correct for optical proximity effects resulting from the proximity of said first component with said first adjusted cell representation if said first component is not fully contained within said first corrected cell representation.

2. The method of claim 1, further comprising the step of adjusting one or more external mask design elements to correct for proximity effects in the mask design, said one or more external mask design elements not wholly contained within any of said cell representations.

3. The method of claim 2, wherein said step of adjusting internal elements of the cell comprises the step of adjusting said internal elements using an optical proximity correction technique.

4. The method of claim 3, further comprising the step of repeating said designing step for a plurality of sub-micron integrated circuit masks.

5. A computer implemented system comprising:

a storage device;

a cell library, located in said storage device, comprising a plurality of cell representations representing cells having internal elements;

a first correction device, located in said storage device, for optically correcting representations of said internal elements within each of said plurality of cells to create one or more corrected cell representations;

a storing means for storing each of said plurality of corrected cell representations in said storage device to create a corrected cell library; and a designing device, coupled to said corrected cell library, for designing a sub-micron integrated circuit mask design, said designing device including:

a placing device for placing one or more of said plurality of corrected cell representations on said integrated circuit mask design such that a minimum distance separates each of said plurality of corrected cell representations to ensure that no proximity effects occur between adjacent corrected cell representations, a determinator, responsive to said placing device, for determining if a first component of said integrated circuit mask design is not fully contained within a first corrected cell representation of said plurality of corrected cell representations, and a component adjuster, responsive to said determinator, for adjusting said first component and said internal elements of said first corrected cell representation to correct for optical proximity effects resulting from the proximity of said first component with said first adjusted cell if said first component is not fully contained within said first corrected cell representation as determined by said determinator.

6. The system of claim 5, wherein said first correction device is an optical proximity correction device.

7. The system of claim 6, further comprising a second correction device, located in said storage device, for correcting said mask design.

8. The system of claim 7, wherein said second correction device is an optical proximity correction device.

9. The system of claim 8, wherein said first correction device comprises said second correction device.

* * * * *